United States Patent [19]
Lin et al.

[11] Patent Number: 6,087,049
[45] Date of Patent: Jul. 11, 2000

[54] MIXED MODE PHOTOMASK FOR OPTICAL PROXIMITY CORRECTION IN A LITHOGRAPHIC PROCESS

[75] Inventors: Chin-Lung Lin, Kaohsiung; Yao-Ching Ku, Hsinchu Hsien, both of Taiwan

[73] Assignee: United Microelectronics Corp., Hsinchu, Taiwan

[21] Appl. No.: 09/457,119

[22] Filed: Dec. 7, 1999

Related U.S. Application Data

[62] Division of application No. 09/345,168, Jun. 30, 1999.

[51] Int. Cl.$^7$ .................................................. G03F 9/00
[52] U.S. Cl. ................................................. 430/5; 430/30
[58] Field of Search ............................................ 430/5, 30

[56] References Cited

U.S. PATENT DOCUMENTS

| | | | |
|---|---|---|---|
| 5,044,750 | 9/1991 | Shamble | 356/401 |
| 5,805,290 | 9/1998 | Ausschnitt et al. | 356/401 |

*Primary Examiner*—Christopher G. Young
*Attorney, Agent, or Firm*—Hickman Stephens Coleman & Hughes, LLP

[57] ABSTRACT

A method of optical proximity correction suitable for use in a mixed mode photomask. An original pattern is to be -transferred from the mixed mode photomask. A binary mask curve and a phase shift mask curve reflecting relationship between critical dimensions of the photomask and the original pattern are obtained. A critical value of the critical dimension is selected. For the binary mask curve, the portion with the critical dimension of the original pattern larger than the critical value is selected. In contrast, for the phase shift mask curve, the portion with the critical dimension of the original pattern smaller than the critical value is selected. These two portions are combined as an optical characteristic curve. The mixed mode photomask can thus be fabricated according to the optical characteristic curve.

6 Claims, 1 Drawing Sheet

MIXED MODE PHOTOMASK FOR OPTICAL PROXIMITY CORRECTION IN A LITHOGRAPHIC PROCESS

This is a Divisional application of copending prior application Ser. No. 09/345,168 filed on Jun. 30, 1999, which designated the United States, the disclosure of which is incorporated herein by reference.

BACKGROUND OF THE INVENTION

1. Field of the Invention

The invention relates in general to a method of optical proximity correction (OPC). More particularly, this invention relates to a method of optical proximity correction using both binary mask and phase shift mask (PSM).

2. Description of the Related Art

Currently, two types of photomasks including the binary mask and the phase shift mask are frequently used for the photolithography process. The phase shift mask provides a better resolution than the binary mask, while the phase shift mask, though provides a better fidelity, is more difficult to fabricate and consumes a higher fabrication cost.

To prevent the deviation of critical dimension while transferring a pattern of a photomask, an optical proximity correction is used to obtain the fidelity of the resultant pattern. An original pattern to be transferred onto a wafer is provided. Being calculated by a computer and a related software, the data of the original pattern is modified to obtained a corrected pattern saved in the computer. The corrected pattern is then fabricated on a photomask. By performing processes such as photolithography and etching, the original pattern is obtained on the wafer.

To optimize the fidelity of a pattern transferred onto the wafer, it is a trend to utilize a mixed mode for both the phase shift mask and the binary mask. However, the optical characteristics of the phase shift mask are very much different from those of the binary mask. The difference in optical characteristics cause a great difficulty in practical application.

FIG. 1 shows a relationship between a critical dimension of a layout on a photomask and a critical dimension of a pattern transferred onto the wafer. The curve a reflects the characteristic for using the phase shift mask, while the curve b illustrates the characteristic for using the binary mask. When the critical dimension reduces to a certain value, the slope of the curve a is increased as the critical dimension decreases. On the contrary, the slope of the curve b is decreased as the increase of the critical dimension. The contradictory behaviors of the curves a and b causes a great difficulty of implementing both the phase shift mask and the binary mask at the same time.

SUMMARY OF THE INVENTION

The invention provides a method of optical proximity correction. An original pattern is provided. A binary mask curve is provided, wherein the binary mask curve reflects a relationship of critical dimensions between a binary mask corrected pattern of the original pattern and the original pattern. A phase shift mask curve is further provided, wherein the phase shift mask curve reflects a relationship of critical dimensions between a phase shift mask corrected pattern of the original pattern and the original pattern. A critical value of the critical dimension of the original pattern is selected. A database comprising data of a portion of the binary mask curve with the critical dimension of the original pattern larger than the critical value, and a portion of the phase shift mask curve with the critical dimension of the original pattern smaller than the critical value is established. A mixed mode corrected pattern is fabricated on photomask according to the original pattern and the data of the database. An exposure step is performed on the photomask, so that the original pattern can be obtained on a wafer.

In one embodiment of the invention, the critical value of the critical dimension of the original pattern is between a range of 1.0 to 2.0 times, preferably, 1.5 times, of a wavelength of an exposure light used for the exposure step. Or alternatively, the critical value can be about 0.25–0.4 microns, preferably 0.3 micron.

By the invention, only one of the phase shift mask and the binary mask is used at a part according to the critical dimension of the required original pattern. Therefore, the conflict in modification using a computer is eliminated and the problems occurred while using a computer aided drawing.

The binary mask is easier to fabricate, however, with a limited resolution. In contrast, the phase shift mask provides a better resolution but is more difficult to fabricate, and the fabrication cost is high. By applying the mixed mode photomask, that is, adapting only one correction method for a pattern with a certain critical dimension, the fabrication process can be simplified, and the fabrication cost can be lowered, while a required fidelity can be obtained. More specifically, for those patterns require a better resolution, the phase shift mask is used to obtain the corrected pattern. For those patterns of which the critical dimension is larger Such that distortion is not obvious, the binary mask is used for the correction.

Both the foregoing general description and the following detailed description are exemplary and explanatory only and are not restrictive of the invention, as claimed.

DESCRIPTION OF THE PREFERRED EMBODIMENTS

The invention provides a model using a mixed mode of photomask for an optical proximity correction. A method to utilize both a binary mask and a phase shift mask is thus provided to resolve the problems occurring in the conventional method.

Figure 1:
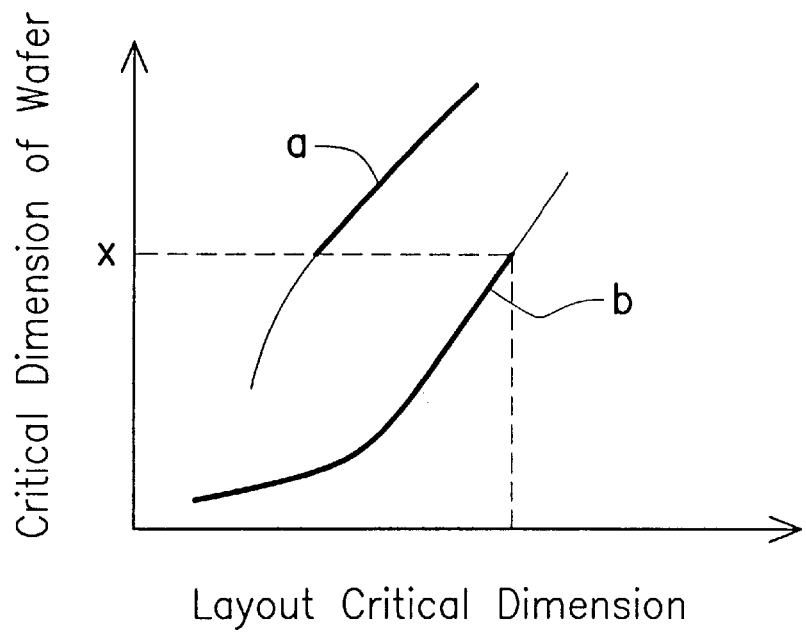
FIG. 1 shows a graph illustrating a relationship of critical dimension between a layout pattern on a photomask and the pattern transferred onto the wafer.
Figure 2:
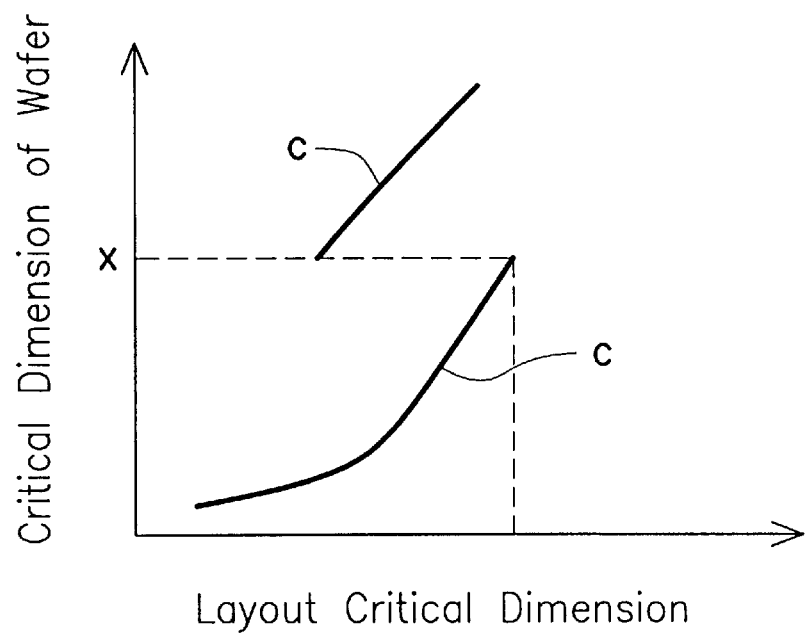
FIG. 2 shows a model by mixing the utility of both a binary photomask and a phase shift mask.

In FIG. 2, a graph illustrating the model using a mixed mode of photomask for optical proximity correction is provided. A critical dimension value x of the pattern transferred onto the wafer is determined by experiments. Each of the curves a and b is segmented into two portions. For the curve a, the portion larger than the value x is selected, while for the curve b, the portion smaller than the value x is selected. The selected portions of curves a and b are then combined as one optical characteristic curve c for performing an optical proximity correction.

The critical dimension value x reflects a critical point for performing an optical proximity correction. To obtain a pattern with a critical dimension value larger than x, the requirement of precision is not so high, or the resulted distortion does not affect the fidelity of this pattern so much.

Therefore, the binary mask is preferably used under the consideration of cost and difficulty of fabrication. As mention above, the critical dimension value x is determined by experiments. In contrast, while a pattern with a critical dimension value is less than x, the demand on precision is great. Apparently the binary mask can not provides the required precision. Therefore, though the fabrication procedure and cost is high, the phase shift mask has to be implemented. Generally, the critical dimension value x determines whether a binary mask or a phase shift mask is used.

In one embodiment of a fabrication process with a linewidth less than 0.3 micron, the critical dimension value x is ranged between about 0.25–0.4 micron, preferably 0.3 micron. Or alternatively, the critical dimension value x can be represented by the wavelength (lambda, $\lambda$) of the exposure light source. For example, the critical dimension value x is very often within the range between 1.0–2.0 lambda, preferably 1.5 lambda. While a KrF laser having a wavelength of about 248.9 nm is used as the exposure light source, the critical dimension value x is preferably set at about 373.35 nm.

In addition, when the critical dimension is equal to the critical dimension value x, either the phase shift mask or the binary mask can be used.

When the critical dimension value x is determined, the optical characteristic curve c can be stored into a database. To transfer an original pattern with an original critical dimension onto a wafer, the layout critical dimension of the pattern to be formed on a photomask can be obtained from the optical characteristic curve c. According to the optical characteristic curve c, the original pattern is modified and fabricated on the photomask as the layout pattern. By exposure, a pattern is then transferred on the wafer with a required fidelity to the original pattern.

More specifically, in the invention, an original pattern to be transferred onto a wafer is provided. With reference to an optical characteristic curve c obtained by the above method, the original pattern is modified and fabricated onto a photomask. For example, when the critical dimension of the original pattern is less than or equal to 1.5 lambda (or 0.3 micron), the layout pattern can be formed on a photomask according to the part of optical characteristic c segmented from the curve b of the phase shift mask. On the other hand, when the critical dimension of the original pattern is larger than or equal to 1.5 lambda (or 0.3 micron), the layout pattern can be formed on a photomask according to the part of the optical characteristic curve c segmented from the curve a of the binary mask. The data of the optical characteristic curve c can then be saved into a database for correcting the original pattern and fabricating a mixed mode layout pattern on a photomask. By performing an exposure onto the photomask, a pattern transferred onto a wafer has a great fidelity of the original pattern.

As mentioned above, by using both the phase shift mask and the binary mask to correct the pattern at the same time, a great difficulty occurs in making the photomask due to the difference in optical characteristics. By the invention, only one of the phase shift mask and the binary mask is used at a single part according to the critical dimension of the required pattern. Therefore, the conflict in modification using a computer is eliminated and the problems occurred while using a computer aided drawing.

The binary mask is easier to fabricate, however, with a limited resolution. In contrast, the phase shift mask provides a better resolution but is more difficult to fabricate, and the fabrication cost is high. By applying the mixed mode photomask, that is, adapting only one correction method for a pattern with a certain critical dimension, the fabrication process can be simplified, and the fabrication cost can be lowered, while a required fidelity can be obtained. More specifically, for those patterns require a better resolution, the phase shift mask is used to obtain the corrected pattern. For those patterns of which the critical dimension is larger such that distortion is not obvious, the binary mask is used for the correction.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A mixed mode photomask, suitable for use in a photolithography process with an exposure light source, comprising:

a layout pattern, further comprising:
a phase shift mask corrected pattern, formed on an area with a critical dimension of the layout pattern less than a critical value; and
a binary mask corrected pattern, formed on an area with the critical dimension of the layout pattern larger than the critical value.

2. The photomask according to claim 1, wherein the critical dimension can be obtained from a relationship between the critical dimension of the layout pattern and a critical dimension of an original pattern to be transferred onto a wafer from the photomask.

3. The method according to claim 2, wherein the critical value is about 1.0–2.0 times of a wavelength of an exposure light source.

4. The method according to claim 3, wherein the critical value is about 1.5 times of the wavelength of the exposure light source.

5. The method according to claim 2, wherein the critical value is about 0.25–0.4 micron.

6. The method according to claim 5, wherein the critical value is about 0.3 micron.

* * * * *